United States Patent
Cummings

(10) Patent No.: US 7,663,794 B2
(45) Date of Patent: **\*Feb. 16, 2010**

(54) METHODS AND DEVICES FOR INHIBITING TILTING OF A MOVABLE ELEMENT IN A MEMS DEVICE

(75) Inventor: William J Cummings, Millbrae, CA (US)

(73) Assignee: Qualcomm MEMS Technologies, Inc., San Diego, CA (US)

( \* ) Notice: Subject to any disclaimer, the term of this patent is extended or adjusted under 35 U.S.C. 154(b) by 0 days.

This patent is subject to a terminal disclaimer.

(21) Appl. No.: 12/014,675

(22) Filed: Jan. 15, 2008

(65) Prior Publication Data

US 2008/0112035 A1 May 15, 2008

Related U.S. Application Data

(60) Continuation of application No. 11/589,582, filed on Oct. 30, 2006, now Pat. No. 7,385,762, which is a division of application No. 11/154,283, filed on Jun. 16, 2005, now Pat. No. 7,130,104.

(60) Provisional application No. 60/613,558, filed on Sep. 27, 2004.

(51) Int. Cl.
*G02B 26/08* (2006.01)
*G09G 3/34* (2006.01)

(52) U.S. Cl. .................. 359/224; 359/290; 359/291; 359/292; 359/295; 359/298; 359/318; 345/85; 345/108; 348/770; 348/771

(58) Field of Classification Search ................ 359/223, 359/224, 290–292, 295, 298, 318; 345/85, 345/108; 348/770, 771
See application file for complete search history.

(56) References Cited

U.S. PATENT DOCUMENTS

| 3,037,189 A | 5/1962 | Barrett et al. |
| 3,210,757 A | 10/1965 | Jacob |
| 3,728,030 A | 4/1973 | Hawes |

(Continued)

FOREIGN PATENT DOCUMENTS

EP     0 361 981     4/1990

(Continued)

OTHER PUBLICATIONS

Pape et al., Characteristics of the deformable mirror device for optical information processing, Optical Engineering, 22(6):676-681, Nov.-Dec. 1983.

(Continued)

*Primary Examiner*—Evelyn A. Lester
(74) *Attorney, Agent, or Firm*—Knobbe Martens Olson & Bear LLP

(57) ABSTRACT

Interferometric modulators having a separable modulator architecture are disclosed having a reflective layer suspended from a flexible layer over a cavity. The interferometric modulators have one or more anti-tilt members that inhibit undesirable movement of the reflective layer, such as curling and/or tilting. The stabilization of the reflective layer by the anti-tilt members can improve the quality of the optical output of the interferometric modulators, as well as displays comprising such interferometric modulators.

22 Claims, 12 Drawing Sheets

U.S. PATENT DOCUMENTS

| | | | |
|---|---|---|---|
| 3,955,190 | A | 5/1976 | Teraishi |
| 4,403,248 | A | 9/1983 | Te Velde |
| 4,441,791 | A | 4/1984 | Hornbeck |
| 4,786,128 | A | 11/1988 | Birnbach |
| 4,859,060 | A | 8/1989 | Katagiri et al. |
| 4,954,789 | A | 9/1990 | Sampsell |
| 4,956,619 | A | 9/1990 | Hornbeck |
| 4,982,184 | A | 1/1991 | Kirkwood |
| 5,022,745 | A | 6/1991 | Zayhowski et al. |
| 5,028,939 | A | 7/1991 | Hornbeck et al. |
| 5,091,983 | A | 2/1992 | Lukosz |
| 5,096,279 | A | 3/1992 | Hornbeck et al. |
| 5,170,283 | A | 12/1992 | O'Brien et al. |
| 5,315,370 | A | 5/1994 | Bulow |
| 5,381,232 | A | 1/1995 | van Wijk |
| 5,471,341 | A | 11/1995 | Warde et al. |
| 5,499,037 | A | 3/1996 | Nakagawa et al. |
| 5,526,172 | A | 6/1996 | Kanack |
| 5,559,358 | A | 9/1996 | Burns et al. |
| 5,636,052 | A | 6/1997 | Arney et al. |
| 5,646,729 | A | 7/1997 | Koskinen et al. |
| 5,646,768 | A | 7/1997 | Kaeriyama |
| 5,661,592 | A | 8/1997 | Bornstein et al. |
| 5,665,997 | A | 9/1997 | Weaver et al. |
| 5,710,656 | A | 1/1998 | Goosen |
| 5,786,927 | A | 7/1998 | Greywall et al. |
| 5,808,781 | A | 9/1998 | Arney et al. |
| 5,818,095 | A | 10/1998 | Sampsell |
| 5,825,528 | A | 10/1998 | Goosen |
| 5,838,484 | A | 11/1998 | Goossen et al. |
| 5,867,302 | A | 2/1999 | Fleming |
| 5,905,482 | A | 5/1999 | Hughes et al. |
| 6,028,689 | A | 2/2000 | Michalicek et al. |
| 6,040,937 | A | 3/2000 | Miles |
| 6,055,090 | A | 4/2000 | Miles |
| 6,172,797 | B1 | 1/2001 | Huibers |
| 6,262,697 | B1 | 7/2001 | Stephenson |
| 6,327,071 | B1 | 12/2001 | Kimura |
| 6,356,378 | B1 | 3/2002 | Huibers |
| 6,384,952 | B1 | 5/2002 | Clark et al. |
| 6,417,868 | B1 | 7/2002 | Bock et al. |
| 6,433,917 | B1 | 8/2002 | Mei et al. |
| 6,438,282 | B1 | 8/2002 | Takeda et al. |
| 6,452,712 | B2 | 9/2002 | Atobe et al. |
| 6,466,354 | B1 | 10/2002 | Gudeman |
| 6,556,338 | B2 | 4/2003 | Han et al. |
| 6,574,033 | B1 | 6/2003 | Chui et al. |
| 6,597,490 | B2 | 7/2003 | Tayebati |
| 6,608,268 | B1 | 8/2003 | Goldsmith |
| 6,632,698 | B2 | 10/2003 | Ives |
| 6,650,455 | B2 | 11/2003 | Miles |
| 6,657,832 | B2 | 12/2003 | Williams et al. |
| 6,661,561 | B2 | 12/2003 | Fitzpatrick et al. |
| 6,674,562 | B1 | 1/2004 | Miles et al. |
| 6,680,792 | B2 | 1/2004 | Miles |
| 6,698,295 | B1 | 3/2004 | Sherrer |
| 6,710,908 | B2 | 3/2004 | Miles et al. |
| 6,741,383 | B2 | 5/2004 | Huibers et al. |
| 6,794,119 | B2 | 9/2004 | Miles |
| 6,813,059 | B2 | 11/2004 | Hunter et al. |
| 6,841,081 | B2 | 1/2005 | Chang et al. |
| 6,844,959 | B2 | 1/2005 | Huibers et al. |
| 6,867,896 | B2 | 3/2005 | Miles |
| 6,870,654 | B2 | 3/2005 | Lin et al. |
| 6,882,458 | B2 | 4/2005 | Lin et al. |
| 6,882,461 | B1 | 4/2005 | Tsai et al. |
| 6,912,022 | B2 | 6/2005 | Lin et al. |
| 6,940,630 | B2 | 9/2005 | Xie |
| 6,947,200 | B2 | 9/2005 | Huibers |
| 6,952,303 | B2 | 10/2005 | Lin et al. |
| 6,958,847 | B2 | 10/2005 | Lin |
| 6,980,350 | B2 | 12/2005 | Hung et al. |
| 6,982,820 | B2 | 1/2006 | Tsai |
| 7,006,272 | B2 | 2/2006 | Tsai |
| 7,119,945 | B2 | 10/2006 | Kothari et al. |
| 7,123,216 | B1 | 10/2006 | Miles |
| 7,126,738 | B2 | 10/2006 | Miles |
| 7,130,104 | B2 * | 10/2006 | Cummings ................ 359/290 |
| 7,161,728 | B2 | 1/2007 | Sampsell et al. |
| 7,198,973 | B2 | 4/2007 | Lin et al. |
| 7,205,722 | B2 | 4/2007 | Koshio et al. |
| 7,221,495 | B2 | 5/2007 | Miles et al. |
| 7,236,284 | B2 | 6/2007 | Miles |
| 7,250,930 | B2 | 7/2007 | Hoffman et al. |
| 7,372,619 | B2 | 5/2008 | Miles |
| 7,385,762 | B2 * | 6/2008 | Cummings ................ 359/578 |
| 2001/0003487 | A1 | 6/2001 | Miles |
| 2001/0028503 | A1 | 10/2001 | Flanders et al. |
| 2001/0043171 | A1 | 11/2001 | Van Gorkom et al. |
| 2002/0015215 | A1 | 2/2002 | Miles |
| 2002/0024711 | A1 | 2/2002 | Miles |
| 2002/0054424 | A1 | 5/2002 | Miles |
| 2002/0070931 | A1 | 6/2002 | Ishikawa |
| 2002/0075555 | A1 | 6/2002 | Miles |
| 2002/0126364 | A1 | 9/2002 | Miles |
| 2002/0146200 | A1 | 10/2002 | Kudrle et al. |
| 2002/0149828 | A1 | 10/2002 | Miles |
| 2003/0016428 | A1 | 1/2003 | Kato et al. |
| 2003/0035196 | A1 | 2/2003 | Walker |
| 2003/0043157 | A1 | 3/2003 | Miles |
| 2003/0053078 | A1 | 3/2003 | Missey et al. |
| 2003/0072070 | A1 | 4/2003 | Miles |
| 2003/0156315 | A1 | 8/2003 | Li et al. |
| 2003/0202265 | A1 | 10/2003 | Reboa et al. |
| 2003/0202266 | A1 | 10/2003 | Ring et al. |
| 2004/0008396 | A1 | 1/2004 | Stappaerts |
| 2004/0008438 | A1 | 1/2004 | Sato |
| 2004/0027671 | A1 | 2/2004 | Wu et al. |
| 2004/0027701 | A1 | 2/2004 | Ishikawa |
| 2004/0043552 | A1 | 3/2004 | Strumpell et al. |
| 2004/0051929 | A1 | 3/2004 | Sampsell et al. |
| 2004/0058532 | A1 | 3/2004 | Miles et al. |
| 2004/0075967 | A1 | 4/2004 | Lynch et al. |
| 2004/0080035 | A1 | 4/2004 | Delapierre |
| 2004/0100594 | A1 | 5/2004 | Huibers et al. |
| 2004/0100677 | A1 | 5/2004 | Huibers et al. |
| 2004/0100680 | A1 | 5/2004 | Huibers et al. |
| 2004/0125281 | A1 | 7/2004 | Lin |
| 2004/0125282 | A1 | 7/2004 | Lin et al. |
| 2004/0145811 | A1 | 7/2004 | Lin et al. |
| 2004/0147198 | A1 | 7/2004 | Lin et al. |
| 2004/0175577 | A1 | 9/2004 | Lin et al. |
| 2004/0184134 | A1 | 9/2004 | Makigaki |
| 2004/0184766 | A1 | 9/2004 | Kim et al. |
| 2004/0207897 | A1 | 10/2004 | Lin |
| 2004/0209195 | A1 | 10/2004 | Lin |
| 2004/0217919 | A1 | 11/2004 | Piehl et al. |
| 2004/0218251 | A1 | 11/2004 | Piehl et al. |
| 2004/0240032 | A1 | 12/2004 | Miles |
| 2005/0002082 | A1 | 1/2005 | Miles |
| 2005/0003667 | A1 | 1/2005 | Lin et al. |
| 2005/0024557 | A1 | 2/2005 | Lin |
| 2005/0035699 | A1 | 2/2005 | Tsai |
| 2005/0036095 | A1 | 2/2005 | Yeh et al. |
| 2005/0046919 | A1 | 3/2005 | Taguchi et al. |
| 2005/0046922 | A1 | 3/2005 | Lin et al. |
| 2005/0046948 | A1 | 3/2005 | Lin |
| 2005/0069209 | A1 | 3/2005 | Damera-Venkata et al. |
| 2005/0078348 | A1 | 4/2005 | Lin |
| 2005/0168849 | A1 | 8/2005 | Lin |
| 2005/0195462 | A1 | 9/2005 | Lin |
| 2005/0249966 | A1 | 11/2005 | Tung et al. |
| 2006/0007517 | A1 | 1/2006 | Tsai |
| 2006/0066938 | A1 | 3/2006 | Chui |

| | | |
|---|---|---|
| 2006/0220160 A1 | 10/2006 | Miles |
| 2006/0262380 A1 | 11/2006 | Miles |
| 2006/0268388 A1 | 11/2006 | Miles |
| 2007/0177247 A1 | 8/2007 | Miles |
| 2007/0229936 A1 | 10/2007 | Miles |
| 2008/0037093 A1 | 2/2008 | Miles |
| 2008/0088904 A1 | 4/2008 | Miles |
| 2008/0088910 A1 | 4/2008 | Miles |
| 2008/0088911 A1 | 4/2008 | Miles |
| 2008/0088912 A1 | 4/2008 | Miles |
| 2008/0106782 A1 | 5/2008 | Miles |
| 2009/0068781 A1 | 3/2009 | Tung et al. |
| 2009/0080060 A1 | 3/2009 | Sampsell et al. |

FOREIGN PATENT DOCUMENTS

| | | |
|---|---|---|
| EP | 1 122 577 | 8/2001 |
| EP | 1 275 997 | 1/2003 |
| EP | 1 439 515 | 7/2004 |
| FR | 2 824 643 | 11/2002 |
| JP | 11211999 | 8/1999 |
| JP | 2002-062490 | 2/2000 |
| JP | 2001-221913 | 8/2001 |
| JP | 2002-221678 | 8/2002 |
| JP | 2003-340795 | 2/2003 |
| JP | 2004-212638 | 7/2004 |
| JP | 2004-212680 | 7/2004 |
| WO | WO 2004/042687 | 5/2004 |
| WO | WO 2005/010566 | 2/2005 |

OTHER PUBLICATIONS

Kowarz et al., Conformal grating electromechanical system (GEMS) for high-speed digital light modulation, Proceedings of the IEEE 15th. Annual International Conference on Micro Electro Mechanical Systems, MEMS 2002, pp. 568-573.

Miles, Interferometric modulation: MOEMS as an enabling technology for high performance reflective displays, Proceedings of SPIE, Vol. 4985, pp. 131-139, 2003.

Conner, "Hybrid Color Display Using Optical Interference Filter Array," SID Digest, pp. 577-580 (1993).

Jerman et al., "A Miniature Fabry-Perot Interferometer with a Corrugated Silicon Diaphragm Support", (1988).

Jerman et al., "Miniature Fabry-Perot Interferometers Micromachined in Silicon for Use in Optical Fiber WDM Systems," Transducers, San Francisco, Jun. 24-27, 1991, Proceedings on the Int'l. Conf. on Solid State Sensors and Actuators, vol. CONF. 6, Jun. 24, 1991, pp. 372-375.

Miles, Mark, W., "A New Reflective FPD Technology Using Interferometric Modulation", The Proceedings of the Society for Information Display (May 11-16, 1997).

Office Action mailed Feb. 16, 2006 in U.S. Appl. No. 11/154,283.

Official Communication in European App. No. 05788595.6 dated Oct. 16, 2007.

ISR and WO for PCT/US2005/029820, filed Aug. 22, 2005.

IPRP for PCT/US05/029820 filed Aug. 22, 2005.

* cited by examiner

|  | Column Output Signals | |
|---|---|---|
|  | $+V_{bias}$ | $-V_{bias}$ |
| Row Output Signals   0 | Stable | Stable |
| $+\Delta V$ | Release | Actuate |
| $-\Delta V$ | Actuate | Release |

METHODS AND DEVICES FOR INHIBITING TILTING OF A MOVABLE ELEMENT IN A MEMS DEVICE

RELATED APPLICATIONS

This application is a continuation of U.S. application Ser. No. 11/589,582 entitled "METHODS AND DEVICES FOR INHIBITING TILTING OF A MIRROR IN AN INTERFEROMETRIC MODULATOR", filed Oct. 30, 2006 (now U.S. Pat. No. 7,385,762, which is a divisional of U.S. application Ser. No. 11/154,283, entitled "METHODS AND DEVICES FOR INHIBITING TILTING OF A MIRROR IN AN INTERFEROMETRIC MODULATOR", filed Jun. 16, 2005 (now U.S. Pat. No. 7,130,104), which claims priority to U.S. Provisional Patent Application No. 60/613,558 entitled "METHOD AND DEVICE FOR INHIBITING TILTING OF A MIRROR" filed on Sep. 27, 2004, all of which are hereby incorporated by reference in their entirety.

BACKGROUND

1. Field of the Invention

The invention relates generally to microelectromechanical systems (MEMS), and more particularly to interferometric modulators and display devices comprising such interferometric modulators.

2. Description of Related Art

Microelectromechanical systems (MEMS) include micro mechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY

The system, method, and devices of the invention each have several aspects, no single one of which is solely responsible for its desirable attributes. Without limiting the scope of this invention, its more prominent features will now be discussed briefly. After considering this discussion, and particularly after reading the section entitled "Detailed Description of Certain Embodiments" one will understand how the features of this invention provide advantages over other display devices.

One aspect of the invention is an interferometric modulator comprising a substrate; an optical layer positioned over the substrate, the optical layer being at least partially transmissive to incident light; a mirror positioned over the substrate and movable between a first position spaced from the optical layer by a first distance and a second position spaced from the optical layer by a second distance, the first distance being greater than the second distance and the mirror having a first surface facing away from the substrate and a second surface facing towards the substrate; and at least one stationary member contacting the second surface of the mirror when the mirror is in the first position, wherein the at least one stationary member is configured to inhibit movement of at least a portion of the mirror when the mirror is in the first position. Advantageously, the one or more stationary members are configured to stabilize the mirror in a manner that improves the optical and/or electromechanical performance of the interferometric modulator and display devices incorporating such interferometric modulators.

In certain embodiments, the at least one stationary member inhibits the movement of at least a portion of the mirror in a direction generally perpendicular to the mirror when the mirror is in the first position. The at least one stationary member may also inhibit the movement of the mirror in a rotational manner and/or in a direction generally parallel to the mirror when the mirror is in the first position.

In some aspects, the at least one stationary member inhibits the movement of the mirror in a rotational manner when the mirror is in the second position, and/or when the mirror occupies a position between the first and second positions. The at least one stationary member may also inhibit the movement of the mirror in a direction generally parallel to the mirror when the mirror is in the second position, and/or when the mirror occupies a position between the first and second positions.

In some aspects, the mirror is substantially planar when in the first position, the second position and/or a position between the first and second positions.

In some aspects, the mirror is not impinged by light incident to the interferometric modulator and/or light reflected by the interferometric modulator.

In some aspects, the at least one stationary member contacts at least a portion of the second surface of the mirror when the mirror is in the first position.

In various aspects, the interferometric modulator further comprises a mechanical layer attached to the mirror that suspends the mirror over the substrate. In some embodiments, the mechanical layer exerts a force on the mirror that facilitates contact between the second surface of the mirror and the at least one stationary member when the mirror is in a first position.

The at least one stationary member may be of any shape and/or configuration that is capable of performing the functions described herein. In some aspects, the at least one stationary member comprises a single segment that is substantially curvilinear. In these aspects, the at least one stationary member can be, for example, generally hook-shaped or cane-shaped.

In some aspects the at least one stationary member comprises a shaft segment that is substantially perpendicular to the mirror, and a head segment connected to the shaft segment. The head segment may be substantially parallel to the shaft segment, at an acute angle to the shaft segment, or in any other configuration that allows the at least one stationary member to inhibit at least a portion of the mirror from movement in at least one direction. In some aspects, the shaft segment inhibits lateral movement of at least a portion of the mirror in a direction generally parallel to the mirror when the mirror is in the first position and/or a position between the first and second positions. The shaft segment may also inhibit rotational movement of at least a portion of the mirror when the mirror is in the first position, the second position, and/or a position between the first and second positions. In some aspects, the head segment inhibits movement of at least a portion of the mirror in a direction generally perpendicular to the mirror when the mirror is in the first position. In some aspects, the mirror contacts the head segment when the mirror is in the first position.

In some aspects, at least a portion of the head segment is wider than the width of at least a portion of the shaft segment. The head segment may comprise any shape and/or configuration so long as the anti-tilt member is able to inhibit at least a portion of the mirror from movement in at least one direction. In some aspects the shaft has a shape that is conical, substantially rectangular, substantially triangular, and/or substantially round. In some aspects the head segment has a shape that is substantially rectangular, substantially conical, barbed, substantially spherical, oblong, and/or substantially hook-shaped.

In some aspects the at least one stationary member and/or the mirror is modified to facilitate contact between them and/or aid the at least one stationary member in inhibiting the movement of at least a portion of the mirror. For example, in some aspects, the at least one stationary member further comprises a convex portion that contacts at least a portion of the mirror when the mirror is in the first position, the second position, and/or a position between the first and second positions. The mirror may also further comprise a recessed portion that contacts the at least one stationary member when the mirror is in the first position, the second position, and/or a position between the first and second positions. In some aspects, a surface of the at least one member and/or the mirror is modified, for example by roughening. The at least one stationary member may also further comprise a contact region that contacts the at least one stationary member when the mirror is in the first position, the second position, and/or a position between the first and second positions. The contact region may comprise a different material than the other portions of the at least one stationary member.

In some aspects, the invention relates to a member for reducing the movement of a mirror in an interferometric modulator. In various aspects, the member inhibits movement of at least a portion of a mirror in an interferometric modulator in a direction substantially parallel to the mirror, in a direction generally perpendicular to the mirror, and/or in a rotational direction. The member may inhibit movement of at least a portion of the mirror when the mirror is in the first position, the second position, and/or a position between the first and second positions. In some aspects, the member comprises a shaft segment that is substantially perpendicular to the mirror and a head segment connected to the shaft segment. In some aspects, the member inhibits movement of at least a portion of a first mirror of a first interferometric modulator and inhibits movement of at least a portion of a second mirror of a second interferometric modulator.

In some aspects, the invention relates to a visual display device comprising a plurality of interferometric modulators of the invention. In some embodiments, the visual display device further comprises one or more of the following components: a processor that is in electrical communication with the display, the processor being configured to process image data; a memory device in electrical communication with the processor; a first controller configured to send at least one signal to the display; a second controller configured to send at least a portion of the image data to the first controller; an image source module, which may comprise at least one of a receiver, transceiver, and transmitter, the image source module being configured to send image data to the processor; and/or an input device configured to receive input data and to communicate the input data to the processor.

In some aspects, the invention relates to is an interferometric modulator comprising a substrate; an optical layer positioned over the substrate, the optical layer being at least partially transmissive to incident light; a mirror positioned over the substrate and movable between a first position spaced from the optical layer by a first distance and a second position spaced from the optical layer by a second distance, the first distance being greater than the second distance and the mirror having a first surface facing toward the substrate and a second surface facing away from the substrate; and at least one stationary mirror-stabilizing means configured to maintain the mirror in a desired orientation when the mirror is in the first position, said mirror-stabilizing means contacting the second surface of the mirror when the mirror is in the first position.

In various aspects, the mirror-stabilizing means is configured to maintain the mirror in a substantially planar orientation when the mirror is in the first position and/or to maintain the mirror substantially parallel to the substrate when the mirror is in the first position. In some aspects, the mirror-stabilizing means is configured to stabilize the mirror in a manner that improves the optical and/or electromechanical performance of the interferometric modulator.

In some aspects, the invention relates to a process for manufacturing an interferometric modulator of the invention.

DETAILED DESCRIPTION OF PREFERRED EMBODIMENTS

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

Figure 1:
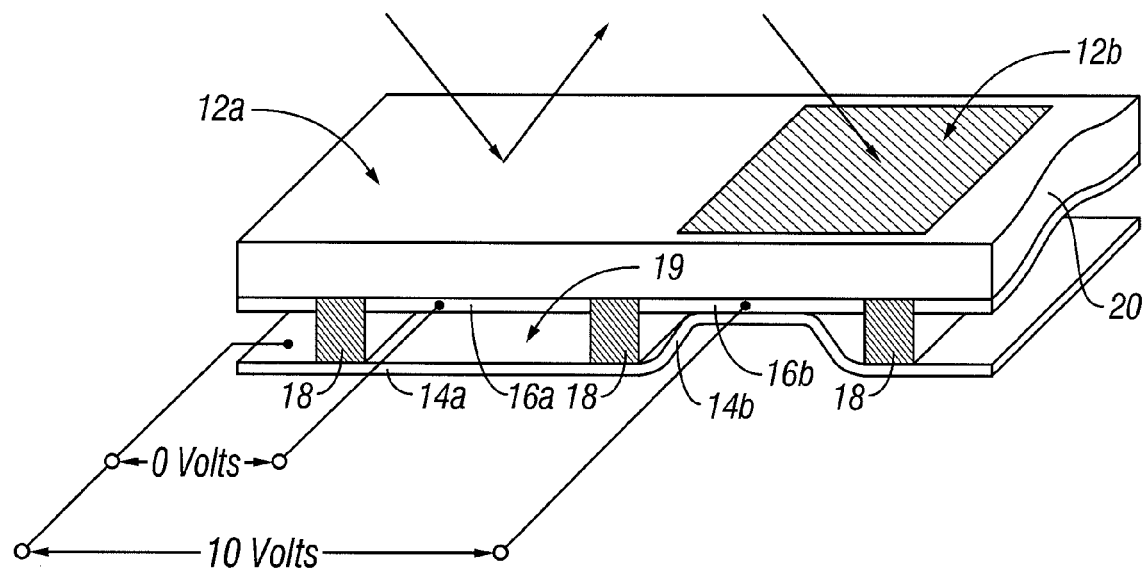
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise several fused layers, which can include an electrode layer, such as indium tin oxide (ITO), a partially reflective layer, such as chromium, and a transparent dielectric. The optical stack 16 is thus electrically conductive, partially transparent and partially reflective, and may be fabricated, for example, by depositing one or more of the above layers onto a transparent substrate 20. In some embodiments, the layers are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the cavity 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5 illustrate one exemplary process and system for using an array of interferometric modulators in a display application.

Figure 2:
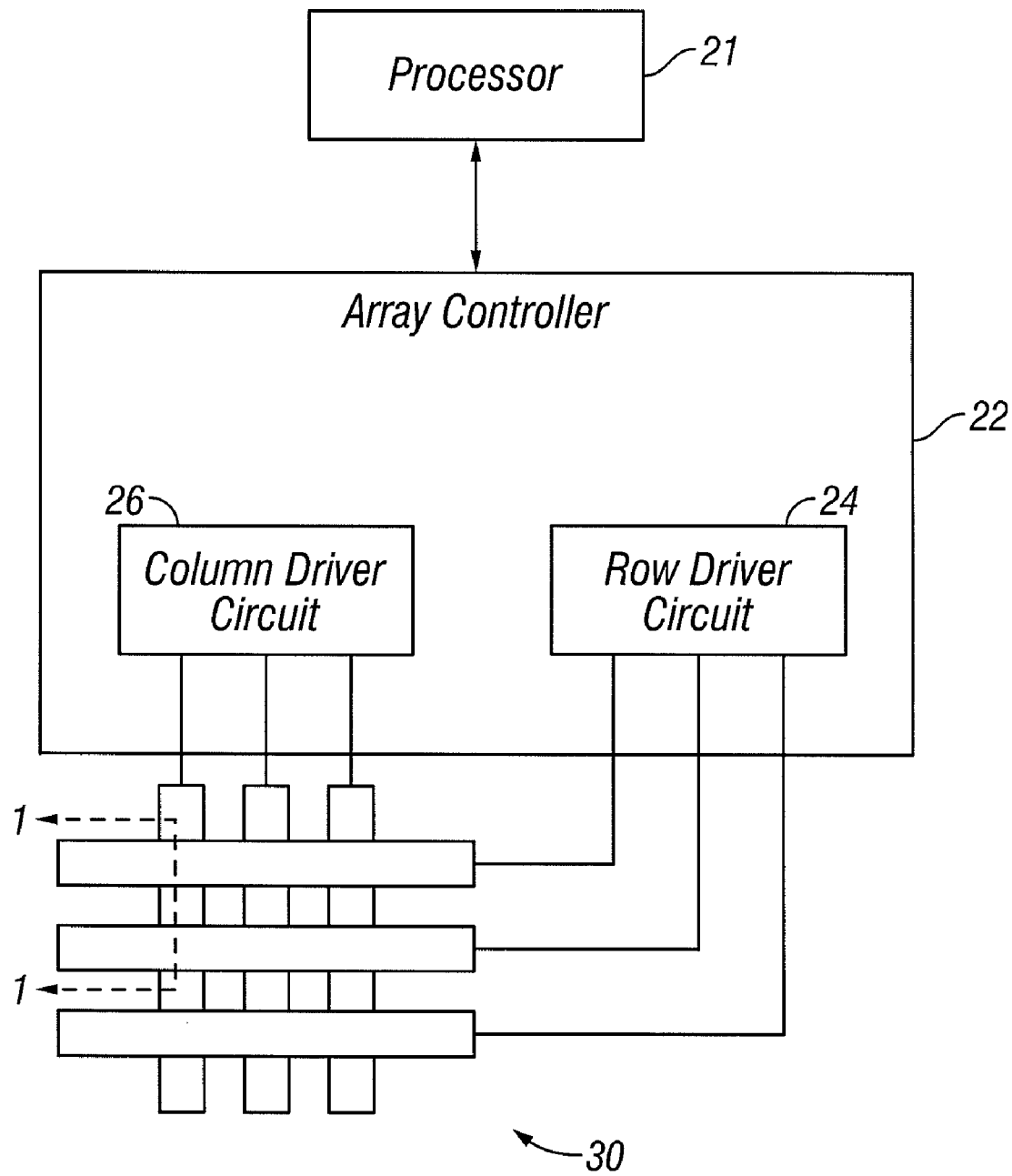
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. There is thus a range of voltage, about 3 to 7 V in the example illustrated in FIG. 3, where there exists a window of applied voltage within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
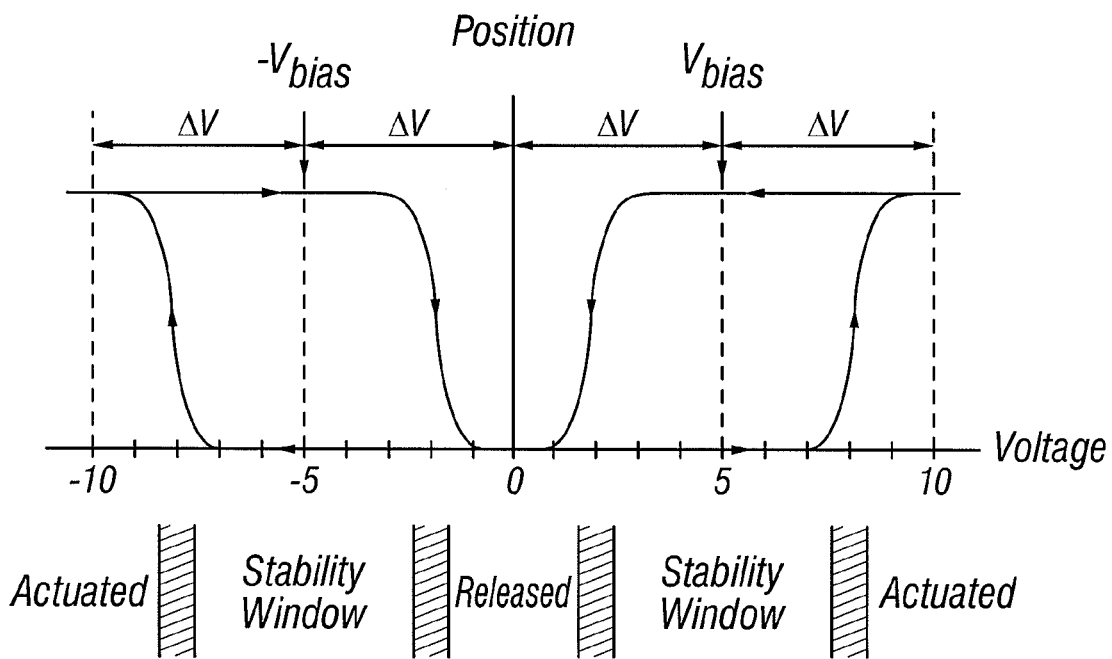
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.

FIGS. 4 and 5 illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts respectively Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

Figure 5A:
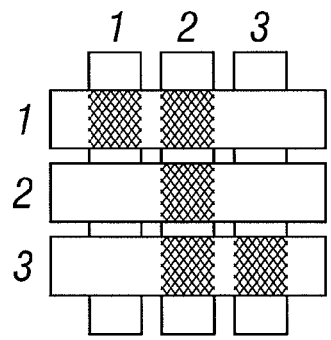
FIGS. 5A and 5B illustrate one exemplary timing diagram for row and column signals that may be used to write a frame of display data to the 3×3 interferometric modulator display of FIG. 2.
Figure 5B:
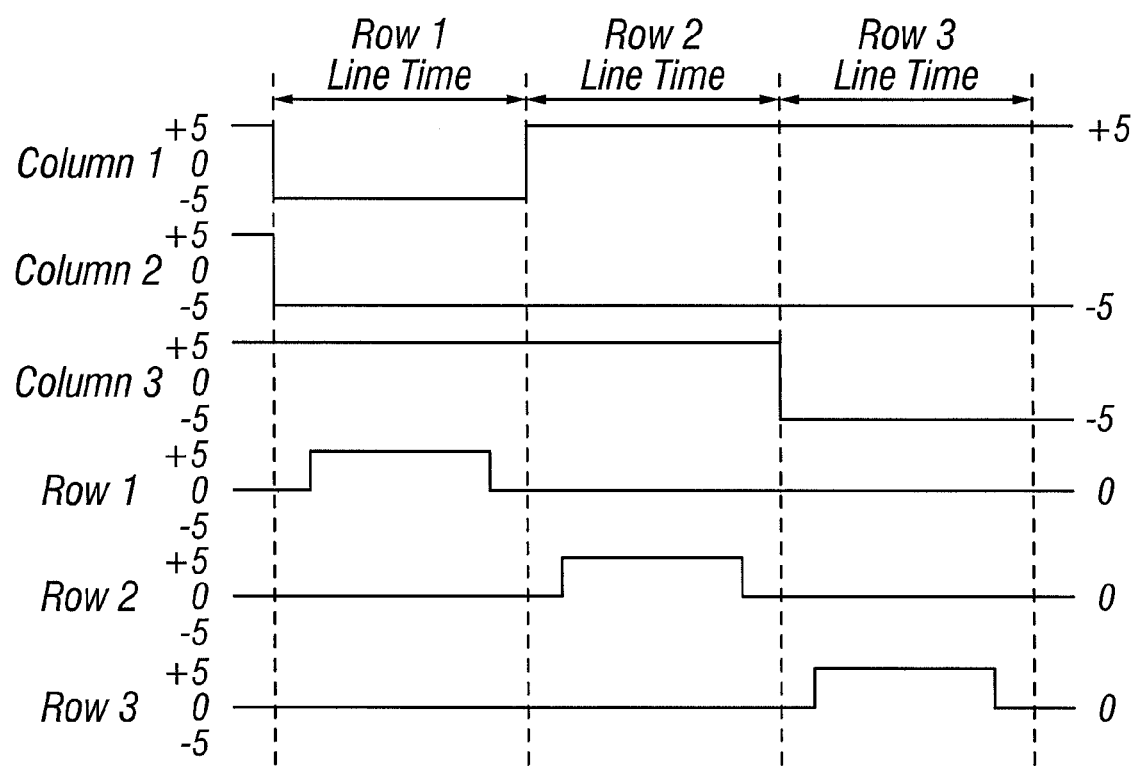

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
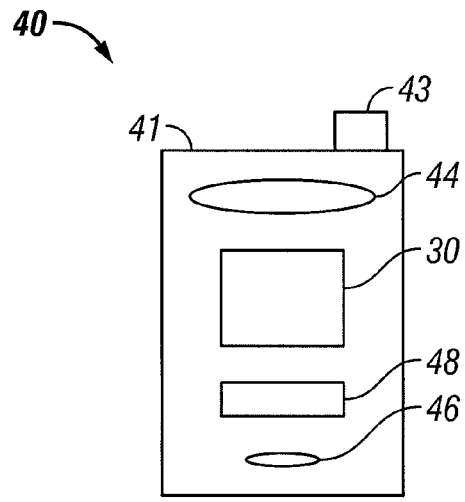
FIGS. 6A and 6B are system block diagrams illustrating an embodiment of a visual display device comprising a plurality of interferometric modulators.
Figure 6B:
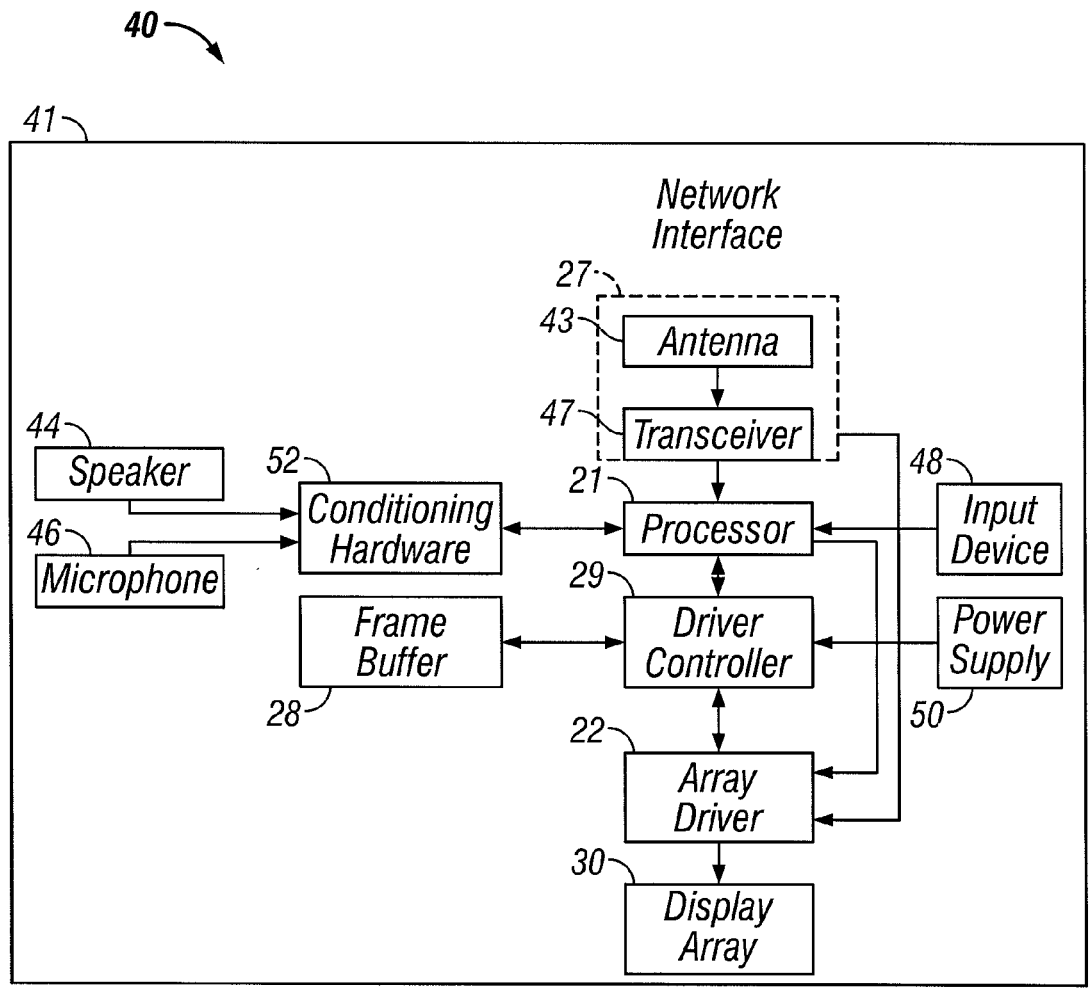

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 44, an input device 48, and a microphone 46. The housing 41 is generally formed from any of a variety of manufacturing processes as are well known to those of skill in the art, including injection molding, and vacuum forming. In addition, the housing 41 may be made from any of a variety of materials, including but not limited to plastic, metal, glass, rubber, and ceramic, or a combination thereof. In one embodiment the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43 which is coupled to a transceiver 47. The transceiver 47 is connected to a processor 21, which is connected to conditioning hardware 52. The conditioning hardware 52 may be configured to condition a signal (e.g. filter a signal). The conditioning hardware 52 is connected to a speaker 45 and a microphone 46. The processor 21 is also connected to an input device 48 and a driver controller 29. The driver controller 29 is coupled to a frame buffer 28, and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a digital video disc (DVD) or a hard-disc drive that contains image data, or a software module that generates image data.

Processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. Conditioning hardware 52 generally includes amplifiers and filters for transmitting signals to the speaker 45, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, input device 48 includes a keypad, such as a QWERTY keyboard or a telephone keypad, a button, a switch, a touch-sensitive screen, a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

Power supply 50 can include a variety of energy storage devices as are well known in the art. For example, in one embodiment, power supply 50 is a rechargeable battery, such as a nickel-cadmium battery or a lithium ion battery. In another embodiment, power supply 50 is a renewable energy source, a capacitor, or a solar cell, including a plastic solar cell, and solar-cell paint. In another embodiment, power supply 50 is configured to receive power from a wall outlet.

In some implementations control programmability resides, as described above, in a driver controller which can be located in several places in the electronic display system. In some cases control programmability resides in the array driver 22. Those of skill in the art will recognize that the above-described optimization may be implemented in any number of hardware and/or software components and in various configurations.

Figure 7A:
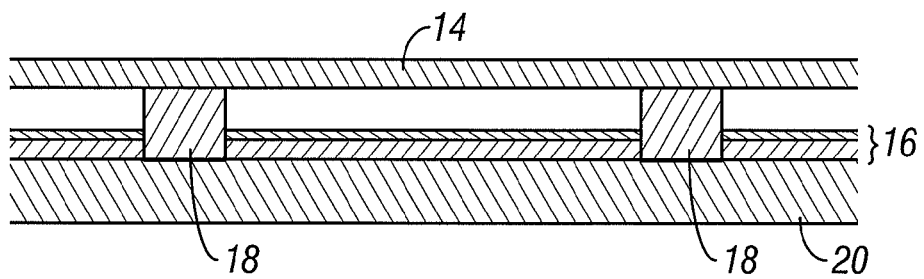
FIG. 7A is a cross section of the device of FIG. 1.
Figure 7B:
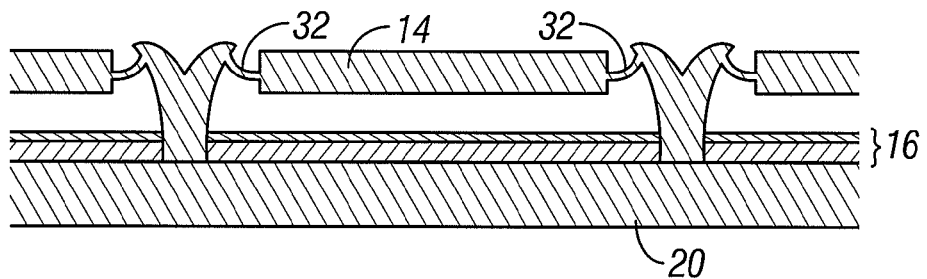
FIG. 7B is a cross section of an alternative embodiment of an interferometric modulator.
Figure 7C:
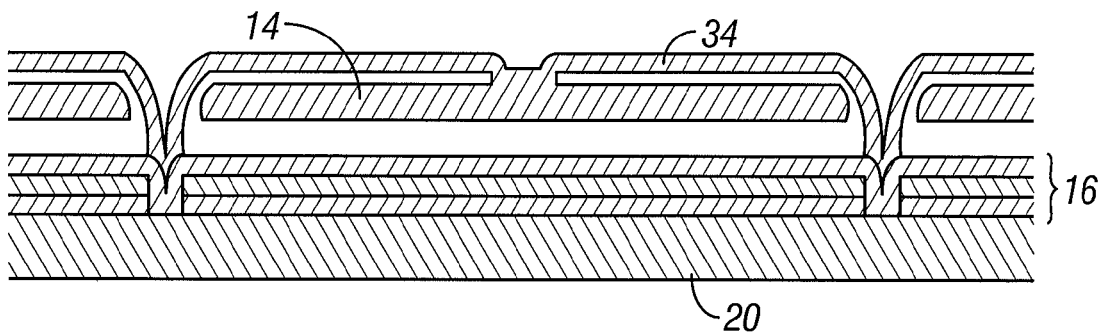
FIG. 7C is a cross section of another alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 is attached to supports at the corners only, on tethers 32. In FIG. 7C, the moveable reflective layer 14 is suspended from a deformable layer 34, which may comprise a flexible metal. The deformable layer 34 connects, directly or indirectly, to the substrate 20 around the perimeter of the deformable layer 34. These connections are herein referred to as support posts. The embodiment illustrated in FIG. 7D has support post plugs 42 upon which the deformable layer 34 rests. The movable reflective layer 14 remains suspended over the cavity, as in FIGS. 7A-7C, but the deformable layer 34 does not form the support posts by filling holes between the deformable layer 34 and the optical stack 16. Rather, the support posts are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

Figure 7D:
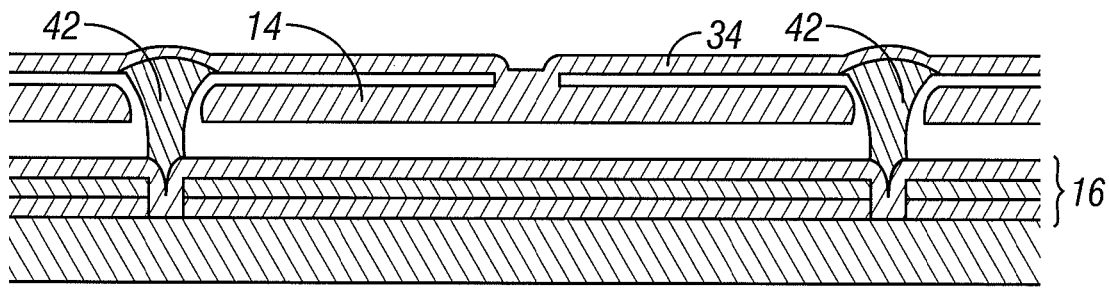
FIG. 7D is a cross section of yet another alternative embodiment of an interferometric modulator.
Figure 7E:
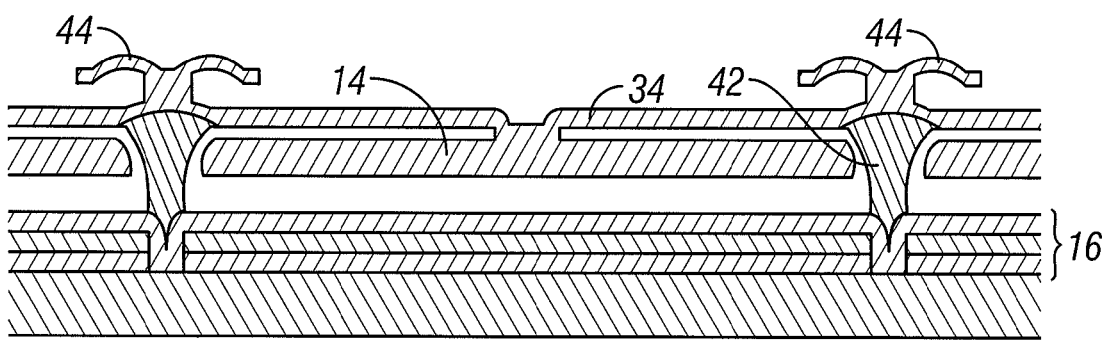
FIG. 7E is a cross section of an additional alternative embodiment of an interferometric modulator.
Figure 8A:
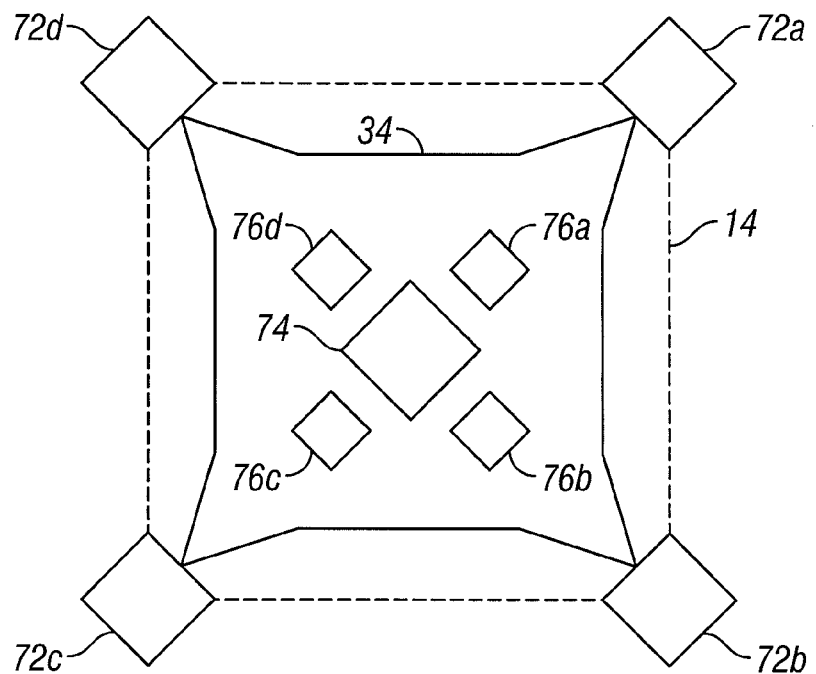
FIG. 8A is a schematic diagram illustrating an embodiment of a back plane support for a separable interferometric modulator.
Figure 8B:
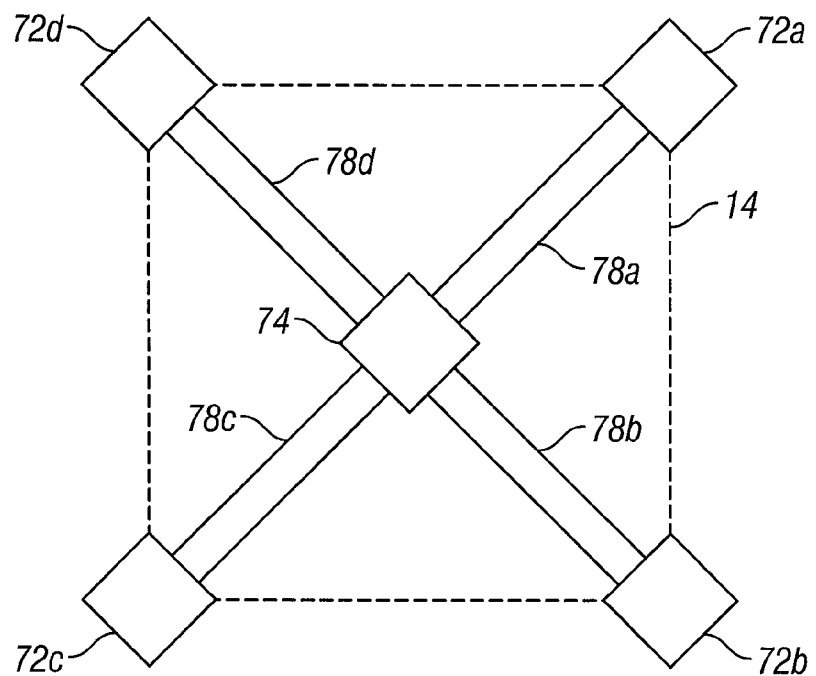
FIG. 8B is a schematic diagram illustrating an alternative embodiment of a back plane of a separable interferometric modulator.

Possible configurations for deformable layer 34 are shown in FIGS. 8a and 8b, which depict views from the back of the modulator, which may also be seen as the bottom of the modulator shown in FIG. 1. In FIG. 8A, the deformable layer 34 is in the form of a flexible membrane supported at its corners by support posts 72a-d, which are anchored in the substrate 20 and/or a layer above the substrate 20, such as the optical stack 16. In the embodiments illustrated in FIGS. 7D and 7E, the support posts 72a-d are in the form of support post plugs 42. The deformable layer 34 connects to the underlying reflective layer 14, demarcated by the dotted line, via a large center back support 74 and four smaller surrounding supports 76a-d. The back support 74 and the surrounding supports 76a-d can be comprised of the same planarization material as support post plugs 42, or of any suitable material. The deformable layer 34 suspends the reflective layer 14 over the optical stack 16.

Alternatively, in FIG. 8B, the deformable layer 34 is patterned to form thin, linear straps 78a-d connected to each support post 72a-d. The straps are attached to the reflective layer 14 by the center support 74. The configurations of FIGS. 8A and 8B are two alternatives, among many possibilities. Interferometric modulators useful in the invention may comprise any configuration that gives the desired freedom of movement to the reflective layer 14 and the desired mechanical characteristics of that movement.

In addition to the freedom afforded by separating the mechanical and optical properties of the reflective layer 14, suspension of the reflective layer 14 by a deformable layer 34 can present additional challenges. For example, the suspended reflective layer 14 may be subject to movements and/or deformations that effect the optical properties of the interferometric modulator. Such movements may degrade the quality of a display incorporating interferometric modulators. For example, the reflective layer 14 may be subject to tilting and/or curling when the reflective layer 14 is in the unconstrained or quiescent position. In addition, the reflective layer 14 may also be subject to undesirable movements in the lateral and/or rotational directions when the reflective layer 14 is in the quiescent position. In many embodiments, the reflective layer 14 abuts the optical stack 16, or a layer directly or indirectly above the optical stack 16, in the actuated position. In these embodiments, tilting and/or curling of the reflective layer 14 would generally not occur as frequently as in the quiescent position. However, the reflective layer 14 may still be subject to undesirable movements when in the actuated position, such as lateral and/or rotational movements. Moreover, the reflective layer 14 may be subject to undesirable movements and/or deformations when in a position between the quiescent and actuated positions.

Figure 9:
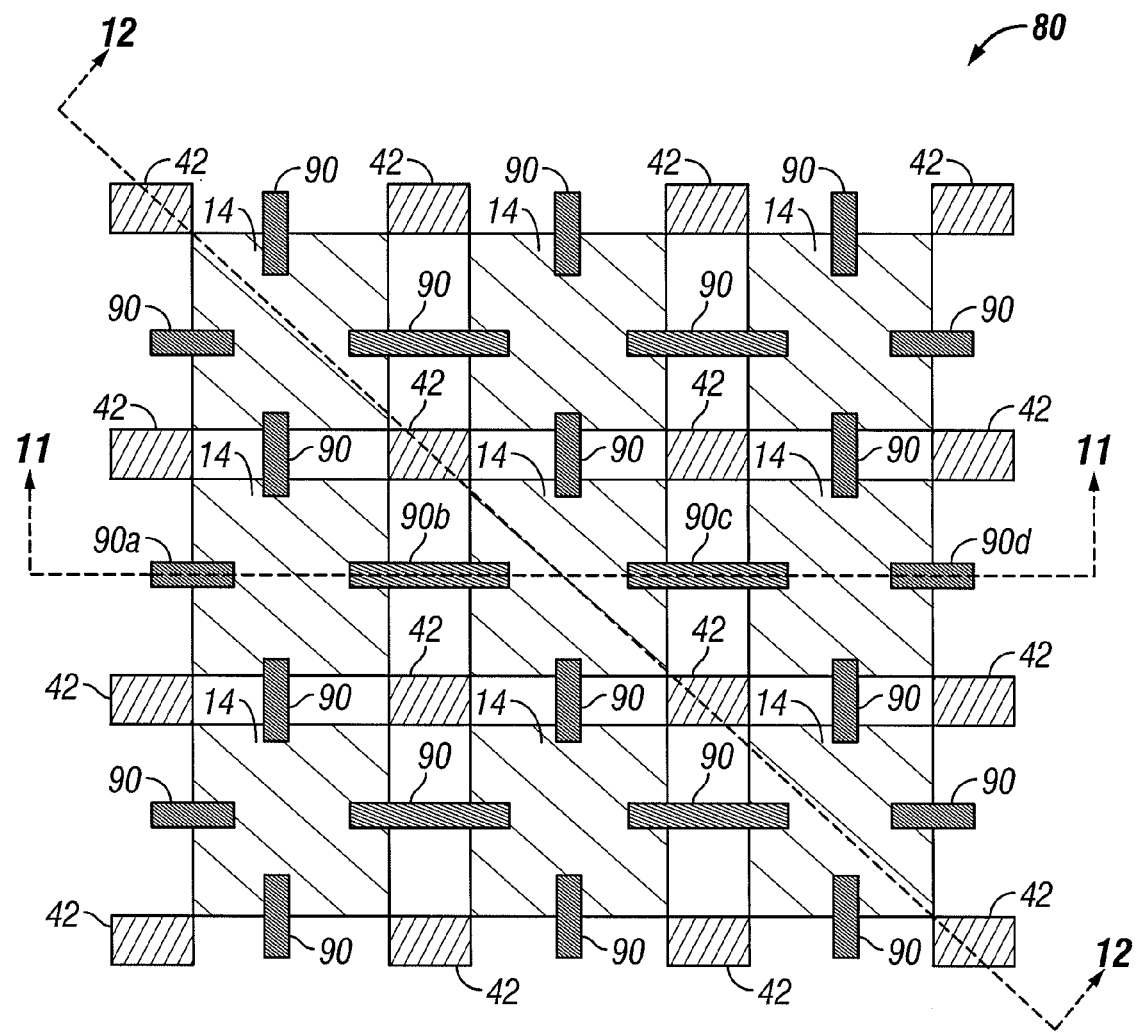
FIG. 9 is a schematic diagram illustrating a layout view of a pixel comprising a 3×3 array of interferometric modulators and anti-tilt members.

In order to improve this aspect, one or more members 90, as shown in FIGS. 9 and 10, may be incorporated into the structure of the interferometric modulator to maintain the reflective layer 14 in a position and/or a conformation that allows a desired optical output. These one or more members are herein referred to as "anti-tilt members" 90. The anti-tilt members 90 inhibit undesirable movements and/or deformations of the reflective layer 14 by providing stationary abutments or contact points with the reflective layer 14 that stabilize the reflective layer 14 and/or constrain the range of movement of the reflective layer 14. For example, in some embodiments, the abutments contact the top surface of the reflective layer 14 (i.e. the surface of the reflective layer 14 facing away from the substrate 20) when the reflective layer 14 is in the quiescent position. In this manner, the anti-tilt members 90 can inhibit the movement of the reflective layer 14 away from the substrate 20 when the reflective layer 14 is in the quiescent position, and/or maintain the reflective layer 14 in an orientation that is substantially parallel to the optical stack 16 when the reflective layer 14 is in the quiescent position. In other embodiments, the anti-tilt members 90 maintain the reflective layer 14 at a fixed angle (i.e. in a non-parallel orientation) relative to the optical stack 16 when the reflective layer 14 is in the quiescent position, so as to produce a desired optical response in the quiescent state.

Advantageously, contact between the anti-tilt members 90 and the reflective layer 14 when the reflective layer 14 is in the quiescent position maintains the reflective layer 14 in a substantially planar orientation, thus inhibiting curling and/or other undesirable deformations of the reflective layer 14. In some embodiments, the anti-tilt members 90 are designed to maximize the proportion of the surface area of the reflective layer 14 that is in contact with the anti-tilt member(s) 90 when the reflective layer 14 is in the quiescent position, in order to enhance the ability of the anti-tilt member(s) 90 to maintain the reflective layer 14 in a substantially planar orientation when in the quiescent position. The number and/or configuration of anti-tilt members 90 utilized in the interferometric modulators of the invention may also be designed to aid in maintaining the reflective layer 14 in a substantially planar orientation.

In some embodiments, the anti-tilt members 90 may occupy one or more fixed positions that define a range of movement of the reflective layer 14 by contacting the reflective layer 14 if the reflective layer 14 moves outside of a path defined by the one or more anti-tilt members 90. For example, anti-tilt members 90 located along the periphery of the reflective layer 14 may inhibit movement of the reflective layer 14 in a direction substantially parallel to the optical stack 16, and/or in a rotational direction.

The anti-tilt members may generally be comprised of any material and may occupy any position and/or configuration that allows them to perform their desired structural function(s). Several embodiments of the anti-tilt members are described more fully below.

FIG. 9 is a plan view of the back (i.e., the side opposite the substrate 20) of a 3×3 array of interferometric modulators, such as those shown in FIGS. 7C-7E, which comprise a pixel 80 in a display. In the illustrated embodiment, each interferometric modulator includes four anti-tilt members, for example 90(a), 90(b), 90(c), 90(d), with one anti-tilt member 90 substantially bisecting each side of each interferometric modulator. However, any number and/or placement of the anti-tilt members may be used. The anti-tilt members 90 located between adjacent interferometric modulators, such as anti-tilt members 90(b) and 90(c), are shared by the same interferometric modulators. The anti-tilt members located around the periphery of the pixel 80, such as anti-tilt members 90(a) and 90(d), are utilized by a single interferometric modulator within pixel 80. However, the location of the interferometric modulator within the pixel 80 need not dictate the arrangement of anti-tilt members 90. For example, additional anti-tilt members 90 can be incorporated to suit a specific application. As explained above, the anti-tilt members 90 can prevent undesirable movements and/or deformations of the reflective layer 14, such as movement in a direction substantially perpendicular to the substrate beyond a certain height (gap) with respect to the optical stack 16.

While each of the interferometric modulators illustrated in FIG. 9 is associated with four anti-tilt members 90, more or less anti-tilt members 90 could be used and still provide the desired benefit of inhibiting undesirable movements of the reflective layer 14, such as curling and tilting. For example, two anti-tilt members 90 could be located on two of the four sides (opposing or adjacent sides) of the interferometric modulators (not shown). In another embodiment (not shown), the anti-tilt members 90 are located at the corners of the interferometric modulator, for example extending from support posts 42 (for illustrative purposes, optional bus structures 44 are not shown). Preferably, the locations of the anti-tilt members 90 around the periphery of the interferometric modulator are selected so as not to interfere with the corner posts 42 or deformable mechanical layer 34.

In addition, the number of anti-tilt members 90 can be different for the sub-pixels or sub-components of the pixel 80 based on, for example, the colors of the sub-components, the depths of the cavities, the sub-components' proximity to the outer perimeter of the display, and/or material properties of the sub-components. Reflective layers 14 that extend farther across a cavity, for example those reflecting red light, or reflective layers 14 located at the perimeter of a display may both be more susceptible to curling and/or tilting than reflective layers 14 associated with shallower optical cavities or located at the interior of the display. Further, each pixel 80 in a display can include a different number of anti-tilt members 90. Additional anti-tilt members 90 can be used to secure a relatively large interferometric modulator for greater stability.

The anti-tilt members 90 are shown in FIG. 9 as having a generally rectangular shape. However, the anti-tilt members may comprise a variety of shapes, as described in more detail below. For example, the shape and/or size of the portions of the anti-tilt members 90 that overlap with the reflective layer 14 may be designed so as to enhance the ability of the anti-tilt members 90 to prevent undesirable movements and/or deformations of the reflective layer 14.

It can be seen in FIG. 9 that the anti-tilt members 90 are located behind the reflective layer 14, and thus are essentially invisible to the human eye due to the optical shielding afforded by the reflective layer 14. Thus, the anti-tilt members can be distributed across the back side of the cavity so as to affect operation of the entire reflective layer 14 without affecting the optical performance of the interferometric modulator or the display device incorporating such interferometric modulators. For illustrative purposes, the deformable layer 34 is not shown in FIG. 9. Examples of possible configurations of the deformable layer 34 on the back of an interferometric modulator are shown in FIGS. 8A and 8B, above.

FIG. 10 is a schematic illustration of several embodiments of the anti-tilt members 90. FIGS. 10a and 10b are schematic illustrations of a cross-sectional view of anti-tilt members, such as 90(b) and 90(c) in FIG. 9, each of which function in connection with two adjacent interferometric modulators. FIGS. 10c and 10d are schematic illustrations of anti-tilt members, such as 90(a) and 90(d) in FIG. 9, which function with respect to a single interferometric modulator. The anti-tilt members 90 have a post, shank, shaft, or other structure 94, referred to herein as a "shaft segment" 94, which is oriented in a substantially upright position relative to the substrate 20, as well as a head segment 92 attached to an end of the shaft segment 94. The distal end 98 of the shaft segment 94 is attached to the optical stack 16, or to another stationary layer located directly or indirectly above or below the optical stack 16, such as the substrate 20. The distal end 98 of the shaft segment 94 or another region of the anti-tilt member 90 may also be attached to any other structure that can provide suitable support for the anti-tilt member 90. The head segment 92 is attached to the end of the shaft segment 94 opposite the distal end 98. The structure and function of the head segment is described in more detail below.

The shaft segment 94 may comprise a material that can be the same as the material used for the corner posts 42, or any other suitable material. The shaft segment 94 has a height, width and shape sufficient to perform its structural function. The width of a particular shaft segment 94 may depend upon the material chosen for the shaft segment 94. In many applications, the shaft segment 94 has a width of between about 0.1 micron and 10 microns and particularly about 3 microns. As described more fully below, the height of the shaft segment 94 may depend on the height of the gap between the reflective layer 14 and the optical stack 16 in the interferometric modulator. In some applications, the shaft segment has a height of about 1 micron to about 10 microns. In the illustrated embodiments, the shaft segment 94 has a slight conical shape. It is contemplated that the shaft segment 94 may be formed in any of a variety of elongated shapes in addition to the slightly conical shape shown in the illustrated embodiments, such as round, rectangular, square, triangular and the like to suit a particular application. A round shape may be preferred to simplify the manufacture of the anti-tilt member 90, although any shape can be used.

As described above, the anti-tilt members illustrated in FIG. 10 comprise a head segment 92 that contacts the reflective layer 14 when the reflective layer is in the quiescent position. The head segment 92 may comprise one or more elements described below, or any structure capable of performing its structural function(s).

Figure 10A:
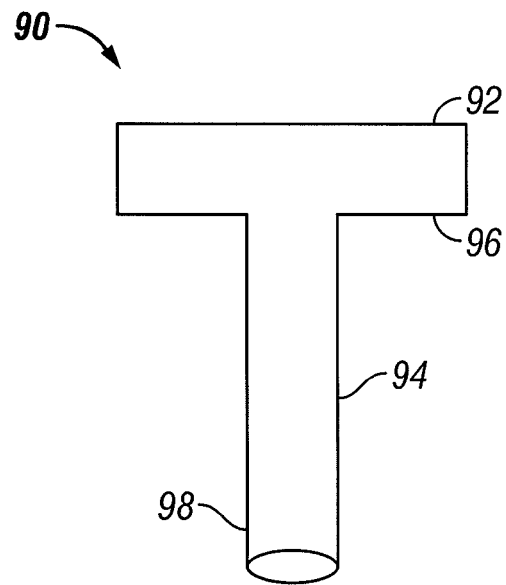
FIGS. 10A-D are cross-sectional views of several embodiments of anti-tilt members.
Figure 10B:
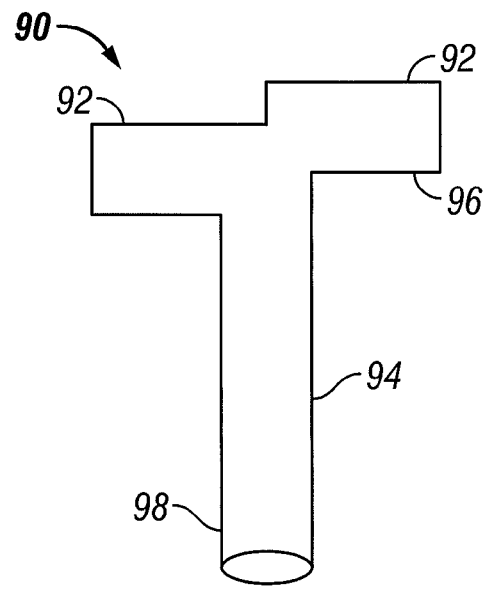
Figure 10C:
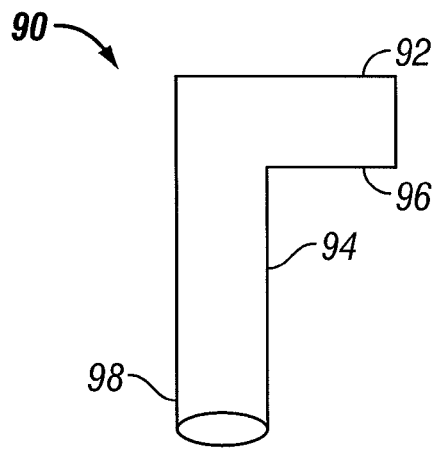

One element that the head segment 92 may comprise is a protrusion that extends from the shaft segment 94. As shown in FIG. 10, the protrusion may comprise an enlarged tip or other structure located at the end of the shaft segment 94 that is distal to the optical stack 16. In various embodiments, at least a portion of the width of the head segment 92 is larger than the width of the shaft segment 94, having a width of, for example, about 2 to 4 times or more of the width of the shaft segment 94. In some embodiments, the shape and size of the head segment is designed to maximize the surface area of contact between the head segment 92 and a surface of the reflective layer 14 when the reflective layer 14 is in the quiescent position, so as to help maintain the reflective layer 14 in a planar orientation. The head segment 92 may be oriented substantially perpendicular to the shaft segment 94, as shown in FIGS. 10a-10c, at an acute angle to the shaft segment 94 (not shown), or in any other orientation with respect to the shaft segment 94 that allows the anti-tilt member to perform its intended functions. The head segment 92 may extend from the shaft segment 94 any distance that allows the head segment 92 to perform its structural function. Advantageously, the head segment 92 extends a sufficient distance from the shaft segment 94 such that the anti-tilt member(s) 90 maintains the reflective layer 14 in a planar orientation when the reflective layer 14 is in contact with the anti-tilt member 90 in the quiescent position.

Figure 10D:
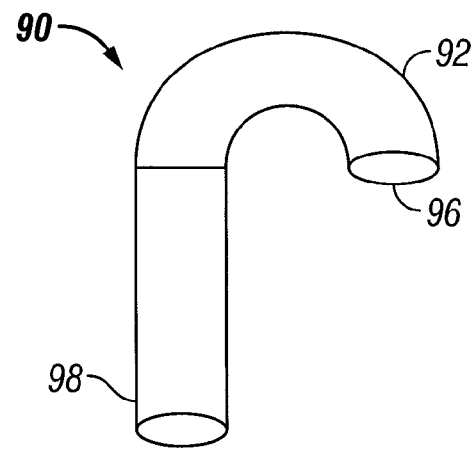

It will be understood that the head segment 92 can take a variety of other shapes, for example, solid or hollow conicals, arrowheads, barbs, spheres, mushroom heads, and other types of projecting structures. In some embodiments, the shaft segment 94 and head segment 92 are in the shape of a cane or a hook, as shown in FIG. 10d, or other structure having a curved region extending above the top surface of the reflective layer 14. The cane shape may be advantageous by allowing the support posts 42 and anti-tilt members 90 to be machined during the same processing step. A relatively blunt end of the head segment 92 is preferred to avoid snagging or interfering with the deformable layer 34, a backside bus 44, and/or other structural components of the interferometric modulator. In some embodiments, the portion(s) of the anti-tilt member 90 that interact with the reflective layer 14 are modified to facilitate the stability or other aspect of the interaction. For example, the underside 96 of the head may comprise an abutment which contacts the top surface of the reflective layer 14 to inhibit curling, tilting, and/or other undesirable movements of the reflective layer 14 when the reflective layer 14 is in the quiescent position.

As seen in FIG. 10, the underside 96 is generally planar. However, the underside 96 may be modified to facilitate contact with the reflective layer 14, such as being curved in a concave fashion to form a recess in which a portion of the reflective layer 14 may rest (not shown). The underside 96 may also be curved in a convex fashion to form a protrusion that interacts with a recessed portion of the reflective layer 14 (not shown). The underside 96 may also have a surface which is roughened or which incorporates ridges or other snagging devices (not shown) to further assist in stabilizing the reflective layer 14. However, the underside 96 may also be smooth, for less expensive fabrication costs.

The head segment 92 may also comprise a hook, as shown in FIG. 10d. The hook may have a radial portion which extends outwardly from the shaft 94. Advantageously, the hook can have a curved portion distal the shaft 94 and positioned toward a distal end of the radial portion (not shown). The curved portion can be sized and configured to accept a recess or receptacle in the top surface of the reflective layer 14 so as to provide lateral stability of the reflective layer 14 (not shown). The recess or receptacle is an additional feature of some embodiments of the reflective layer 14. Desirably, the curved portion has a chamfer or taper along the distal circumference to allow the curved portion to easily fit the recess in the top surface of the reflective layer 14. For embodiments of the hook not having the curved portion, the radial portion may contact the top surface of the reflective layer 14.

The shaft segment 94 and head segment 92 can also take the form of a clip (not shown) formed on the surface of the optical stack 16, or another stationary layer directly or indirectly above or below the optical stack 16. In various embodiments, the clip is sized and shaped to fit around the outer portion of the reflective layer 14 while allowing the reflective layer 14 to translate within the cavity. The clip can be configured in a variety of ways to achieve its purpose. For example, in one embodiment, the clip is substantially C-shaped, with the concave region of the clip forming a portion within which the reflective layer 14 is captured. In one embodiment, the lower portion of the C-shaped clip is attached to and rests upon the optical stack 16. Alternatively, a pair of semi-rigid, inverted L-shaped members that are closely spaced apart and back-to-back inhibit undesirable movements and/or deformation of the reflective layers 14 of two adjacent interferometric modulators. As will be understood by one skilled in the art, a variety of other clip configurations, such as a single L-shaped clip or a single T-shaped clip, can be used to achieve the purpose of the anti-tilt members.

FIG. 10b shows the head segment 92 having a generally rectangular shape with a stepped top surface. Each end of the rectangular head segment 92 extends towards a different interferometric modulator. The stepped top surface corresponds to the change in depth of the cavities of adjacent interferometric modulators due to the differences in the distances between the reflective layers 14 and the optical stack 16 when the reflective layers 14 are in the quiescent position. For example, referring to FIG. 10b, the interferometric modulator incorporating the left side of the anti-tilt member 90 has a shallower cavity than the cavity for the adjacent interferometric modulator incorporating the right side of the anti-tilt member. In other embodiments, a flat head, a multi-stepped head, or any suitably shaped head, can also be used. For example, in embodiments where the cavity depths of two adjacent interferometric modulators are the same, the head segment 92 may not include a step, as shown in FIG. 10a. Alternatively, where the anti-tilt member 90 functions in connection with a single interferometric modulator, such as anti-tilt members 90(a) and 90(c) in FIG. 9, only a single head segment 92 is attached to the shaft segment 94, as shown in FIGS. 10c and 10d. In various embodiments, the thickness (es) of the head segment 92 can be varied depending on the material properties of the head segment 92.

Figure 11:
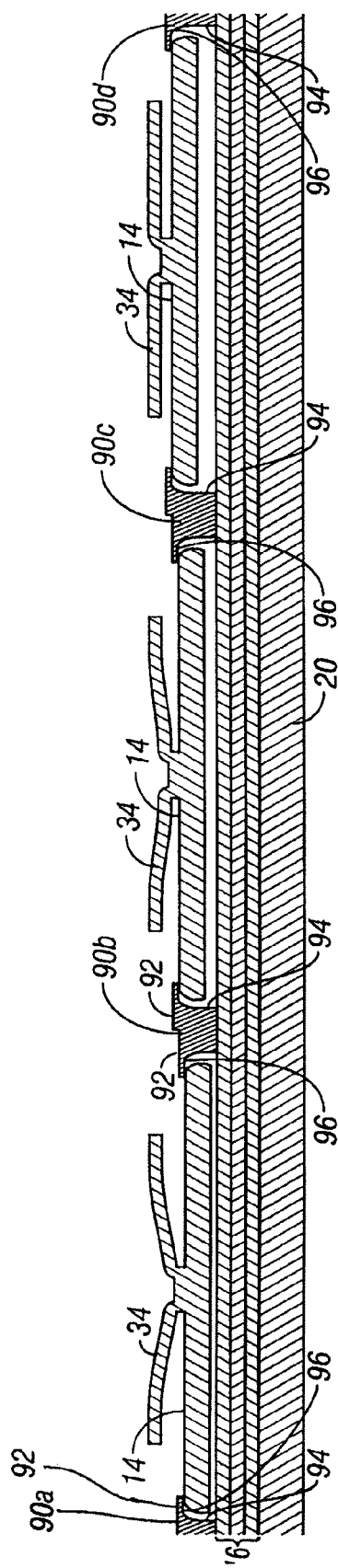
FIG. 11 is a cross-sectional view taken along line 11-11 of FIG. 9 showing the anti-tilt members located between the adjacent interferometric modulators of the array in FIG. 9.

Referring to FIG. 11, which shows a cross-sectional view of the array illustrated in FIG. 9 along line 11-11. The anti-tilt members 90 (e.g., anti-tilt members 90a-90d) extend in an upright direction from the optical stack 16, or from another stationary layer directly or indirectly above or below the optical stack 16, such as the substrate. The shaft segments 94 can have a variety of lengths and a variety of distances between them, depending upon the particular application and the particular interferometric modulator with which they are to interact to stabilize the reflective layer 14. Shaft segments 94 located on opposite sides of the interferometric modulator are laterally spaced at least wide enough to accommodate the reflective layer 14 to be stabilized. Desirably, the shaft segments 94 are spaced apart by a distance slightly greater than the distance between the sides of the reflective layer 14 to provide clearance for the reflective layer 14. In many applications, the distance between the shaft segments 94 will be between about 10 microns and about 200 microns, and more particularly about 100 microns.

The three interferometric modulators illustrated in FIG. 11 are in the quiescent state. As shown, the left most interferometric modulator has a shallower optical cavity (i.e., a lesser distance between the reflective layer 14 and the optical stack 16 when the reflective layer 14 is in the quiescent position). To accommodate the differing cavity dimensions, the anti-tilt member 90b located between the left-most and center interferometric modulators has a stepped head segment 92, with the left side of the head segment 92 contacting the top of reflective layer 14 of the left-most interferometric modulator, and the right side of the head segment 92 contacting the top of reflective layer 14 of the center interferometric modulator. The stepped head segment reduces the chance that the distal surface of the head segment 92 interferes with the deformable layer 34 and simplifies manufacture. To this end, the thickness of the ends of the head segment 92 are advantageously selected to fit between the top surfaces of the reflective layer 14 and the bottom surfaces of the deformable layers 34.

Advantageously, each shaft segment 94 and head segment 92 inhibit movement of at least a portion of the reflective layer 14 in a direction substantially perpendicular to the substrate 20, substantially parallel to the substrate 20, and/or in a rotational direction. In some embodiments, side to side, lateral, and/or rotational movement of the reflective layer 14 is inhibited by contact with the shaft segments 94 of one or more anti-tilt members 90 (e.g., anti-tilt members 90a-90d), which are secured to the optical stack 16 or another structure of the interferometric modulator, and are of sufficiently rigid construction to act as a stop against movement of the reflective layer 14 in the transverse, lateral and/or rotational direction. Inhibition of movement of the reflective layer 14 in a transverse, lateral and/or rotational direction is advantageous because such movement can translate into optical distortion and impact the clarity of the display. This movement, in turn, can also cause the reflective layer 14 to roll or slip from under the head 92.

In some embodiments, the deformable layer 34 imparts a restoring force on the reflective layer 14 in the absence of any electrical force between the reflective layer 14 and the stationary layers below the reflective layer, including the optical stack 16. Advantageously, the restoration force is sufficient to pull the reflective layer 14 up into contact with the anti-tilt member 90 (e.g., anti-tilt members 90a-90d) when the reflective layer 14 is in the quiescent position. Preferably, the restoration force is selected such that the range of motion of the reflective layer 14 is minimal until the actuation voltage is applied. Advantageously, by selecting the restoration force the interferometric modulator can be optimized so that the voltage and color are independently controlled.

Figure 12:
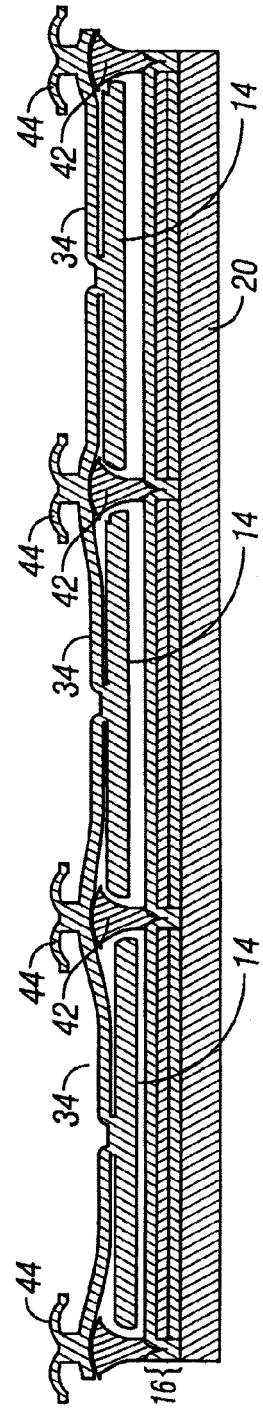
FIG. 12 is a diagonal cross-sectional view taken along line 12-12 of FIG. 9 showing the post supports for the interferometric modulators of the array in FIG. 9.

FIG. 12 is a cross-sectional view of the array illustrated in FIG. 9 along line 12-12, showing the support posts 42 and bus structures 44 located at the corners of each interferometric modulator. The anti-tilt-members cannot be seen in FIG. 12, since they bisect the sides of the reflective layers 14 of each interferometric modulator (and view 12-12 illustrates a cross-section along a diagonal line with respect to the corners of the reflective layers 14). This configuration may be preferable so that the anti-tilt members 90 (e.g., anti-tilt members 90a-90d) do not interfere with the functionality of the support posts 42 and/or the bus structures 44. However, the anti-tilt-members can be located at any position relative to the support posts 42 and bus structures 44, including at the corners of the interferometric modulator.

The production of various types of interfermetric devices is described in a variety of published documents, including, for example, published U.S. Pat. application Ser. No. 2004/0051929. A wide variety of techniques well known in the art may be used to produce the above described structures involving a series of material deposition, patterning, and etching steps. For example, the anti-tilt members 90 can be constructed of common thin-film-process-compatible material using deposition and lithography techniques that may also be used for the other layers of the interferometric modulator. The material for the anti-tilt members 90 can be identical to the material used for the corner posts. Alternatively, a different material can be used. Exemplary processes for manufacturing the anti-tilt members 90 are described with reference to FIG. 13.

Figure 13:
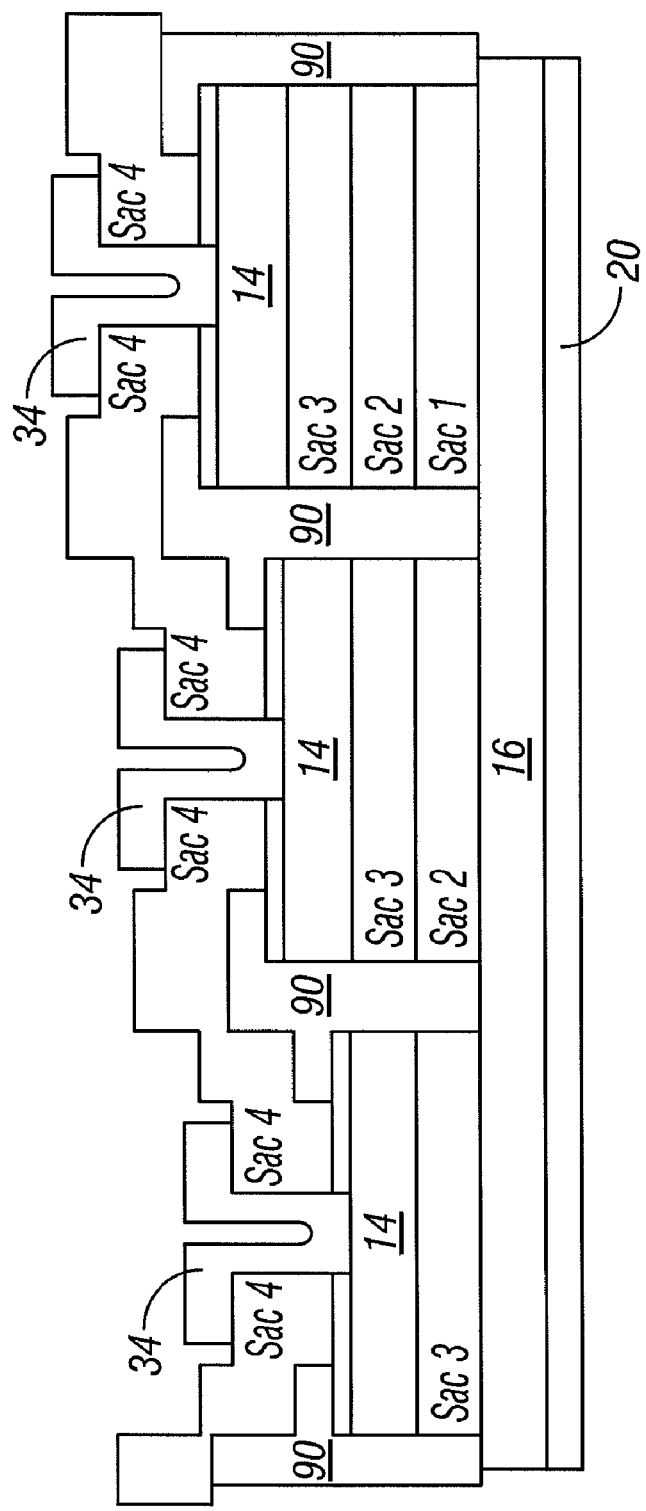
FIG. 13 is a cross-sectional view similar to FIG. 11 that further illustrates the material layers that are applied to manufacture interferometric modulators having the anti-tilt members.

FIG. 13 is a cross-sectional view similar to FIG. 11 that further illustrates the material layers that are applied to manufacture interferometric modulators having the anti-tilt members 90.

The embodiments described herein having different configurations may have some processing steps in common to form the anti-tilt members 90. The interferometric modulators are typically constructed on a transparent substrate 20. The optical stack 16 is deposited on substrate 20, and typically comprises several fused layers, including an electrode layer (not shown) formed on the substrate out of an appropriate material, such as indium tin oxide (ITO), a partially reflective layer (not shown), such as chrome, and a dielectric (not shown). The viewing surface of the transparent substrate is on the 'bottom' of the substrate, the opposite side of the substrate than that upon which the optical stack 16 is formed. In a process not shown here, the electrode and metal layers are patterned and etched to form electrode columns, rows or other useful shapes as required by the display design.

Formed on top of the optical stack 16 is a first sacrificial layer 130(a) and the reflective layer 14. The sacrificial layers 130 will determine the dimension of the cavity over which the reflective layer 14 is suspended. As discussed above, color modulators may be formed by using three modulator elements for each pixel in the resltant image. In interferometric modulators, the dimension of the cavity often determines the nature of the interference. One method of forming color pixels is to construct cavities of differing depths such that the resultant quiescent colors from three different depths of cavities are red, green and blue. The interference properties of the cavities are directly affected by their depth. In order to produce these varying cavity dimensions, one, two, or three sacrificial layers, 130(*a*), 130(*b*), 130(*c*), respectively, may be deposited. A first layer 130(*a*) is deposited, masked and patterned to define the area of one of the three modulators forming each pixel; a second layer 130(*b*) is then deposited. A second mask is then applied to this layer, and is patterned to define the combined area of the first modulator defined above as well as the second modulator forming each pixel. Finally, a third sacrificial layer 130(*c*) is applied. The third layer 130(*c*) need not be patterned, since its thickness is included in all three of the modulators forming each pixel.

The three individual deposited layers 130(*a*)-130(*c*) described here would not necessarily be of the same thickness. Thus, the modulators can have a range of cavity heights corresponding to the combined thicknesses of the various layers. For example, adjacent interferometric modulators within a pixel may have a cavity height corresponding to the combined thickness of three layers, the combined thickness of two layers, and/or the combined thickness of a single sacrificial layer. When the sacrificial layer materials are removed, the cavity dimensions will vary according to the various combined thicknesses of the three sacrificial layers, resulting in varying cavity dimensions corresponding, for example, to three different colors such as red, green and blue.

To form the anti-tilt members 90, a photoresist layer is deposited and patterned appropriately over the reflective layer 14. After the reflective layer 14 is patterned a fourth sacrificial layer 130(*d*) is added. Holes for the anti-tilt members 90 are then drilled through the sacrificial layers 130 and down to the optical stack 16. For embodiments that use a round drill, the resulting shaft desirably has a round shape. Post material is then added and patterned to overhang the outer periphery of the reflective layer 14.

Depending on the selected modulator, additional processing steps can form corner posts 42 (see FIG. 12), the deformable layer 34, and the like. These additional steps can be combined with the preceding steps. For example, curved or cane shaped anti-tilt members 90 that extend to the height of the corner posts can be machined at the same time that the posts are machined. Finally, if no bussing layer is to be used, the sacrificial layers 130(*a*), 130(*b*), 130(*c*), and 130(*d*) are removed. The resulting modulators have a cavity in which the reflective layer 14 is suspended over the optical stack 16. The etch operation also results in the formation of the anti-tilt members 90. The natural tendency of the reflective layers 14 to move away from the optical stack 16 can be exploited when the reflective layers 14 contact the heads segments of the anti-tilt members 90 (not shown).

During removal of the sacrificial layers from below and above the reflective layer 14, the sacrificial layer 130(*d*) may be removed before the sacrificial layers 130(*a*), 130(*b*), and 130(*c*) are removed. With the sacrificial layer 130(*d*) removed, sacrificial layer 130(*c*) may subject the reflective layer 14 to a non-distributed load due to the sacrificial layer 130(*c*) pulling on the reflective layer 14. Without the anti-tilt member 90, this non-distributed load can result in undesirable movement of the reflective layer 14, such as curling of the face of the reflective layer 14. Advantageously, the anti-tilt members 90 can inhibit undesirable movement of the reflective layer 14 during removal of the sacrificial layers 130.

In an alternative approach (not shown), a different arrangement of the material layers is used to manufacture interferometric modulators having the anti-tilt members 90. In this approach the depositions of sacrificial layers 130(*a*), 130(*b*), and 130(*c*) are blanket depositions, and the color pixel separation comes from patterning the height of the anti-tilt members 90. This design requires enough upward force on the reflective layer 14 to launch all the way from the lowest to the highest gap desired. This design has significant advantages for the final planarization step as there is no step height difference between pixels of different colors.

In this manner, the manufacture and operation of interferometric modulators may be improved. The use of features to inhibit undesirable movement, such as tilting or curling, of the reflective layer 14 improves the display quality. The separation of the optical properties from the electromechanical properties may result in previously unavailable opportunities, due to the separation of the deformable layer 34 from the optical properties of the modulator.

While the above detailed description has shown, described, and pointed out novel features as applied to various embodiments, it will be understood that various omissions, substitutions, and changes in the form and details of the device or process illustrated may be made by those skilled in the art without departing from the spirit of the embodiments. Methods for incorporating the features described above with interferometric modulators will be readily apparent to one having ordinary skill in the art. Further, one or more of these features may be adapted to work with any of the embodiments, as well as other configurations of the interferometric modulators. As will be recognized, an anti-tilt member may be provided that does not involve all of the features and benefits set forth herein, as some features may be used or practiced separately from others.

What is claimed is:

1. An electromechanical device comprising:
   a substrate;
   an electrically conductive layer over the substrate;
   a movable element positioned over the substrate and movable between a first position spaced from the substrate by a first distance and a second position spaced from the substrate by a second distance, the first distance being greater than the second distance, and the movable element having a first surface facing away from the substrate and a second surface facing towards the substrate;
   at least one stationary member contacting the first surface of the movable element when the movable element is in the first position, wherein the at least one stationary member is configured to inhibit movement of at least a portion of the movable element when the movable element is in the first position, and further wherein the second surface of the movable element is substantially parallel to the substrate when the movable element is in the first position and the second position; and
   a mechanical layer coupled to the movable element, wherein the mechanical layer exerts a force on the movable element that facilitates contact between the at least one stationary member and the first surface of the movable element when the movable element is in the first position.

2. The device of claim 1, wherein the at least one stationary member comprises a first stationary member and a second stationary member contacting the first surface of the movable element when the movable element is in the first position, and further wherein the first stationary member and the second stationary member contact the first surface of the movable element at substantially the same distance from the substrate.

3. A device comprising an array of a plurality of the electromechanical devices as claimed in claim 1.

4. The device of claim 3, wherein the at least one stationary member comprises a shaft segment, a first head segment connected to the shaft segment and contacting the movable element of a first electromechanical device of the plurality of electromechanical devices, and a second head segment connected to the shaft segment and contacting the movable element of a second electromechanical device of the plurality of electromechanical devices.

5. The device of claim 4, wherein the at least one stationary member inhibits movement of at least a portion of the movable elements of each of the first and second electromechanical devices in a direction generally perpendicular to the first surfaces of the movable elements when the movable elements are in the first position.

6. The device of claim 4, wherein the at least one stationary member inhibits movement of at least a portion of the movable elements of each of the first and second electromechanical devices in a direction generally parallel to the first surfaces of the movable elements when the movable elements are in the first position.

7. The device of claim 4, wherein the at least one stationary member inhibits rotational movement of at least a portion of the movable elements of each of the first and second electromechanical devices when the movable elements are in the first position.

8. The device of claim 1, wherein the mechanical layer comprises a first portion attached to the movable element and a second portion attached to the at least one stationary member.

9. The device of claim 1, wherein the movable element comprises a reflecting element.

10. An electromechanical device comprising:
    means for supporting at least a portion of the electromechanical device;
    first electrically conductive means for receiving an electrical signal, the first electrical conductive means positioned over the supporting means;
    second electrically conductive means for receiving an electrical signal, the second electrical conductive means positioned over the supporting means, the second electrically conductive means movable between a first position spaced from the first electrically conductive means by a first distance and a second position spaced from the first electrically conductive means by a second distance, the first distance being greater than the second distance, wherein the second electrically conductive means has a first surface facing away from the supporting means and a second surface substantially parallel to the supporting means when the second electrically conductive means is in the first and second positions;
    means for stabilizing the second electrically conductive means, the stabilizing means contacting the first surface of the second electrically conductive means when the second electrically conductive means is in the first position, wherein the stabilizing means is configured to inhibit movement of at least a portion of the second electrically conductive means when the second electrically conductive means is in the first position; and
    means for exerting a force on the second electrically conductive means, the force facilitating contact between the stabilizing means and the first surface of the second electrically conductive means when the second electrically conductive means is in the first position.

11. The device of claim 10, wherein the supporting means comprises a substrate.

12. The device of claim 10, wherein the first electrically conductive means comprises a metal layer.

13. The device of claim 10, wherein the stabilizing means comprises at least one stationary member.

14. The device of claim 10, wherein the second electrically conductive means comprises a metal layer.

15. The device of claim 10, wherein the force exerting means comprises a mechanical layer.

16. The device of claim 10, wherein the second electrically conductive means comprises a reflecting layer.

17. An electromechanical device comprising:
    a display comprising a plurality of display elements, each display element comprising:
      a substrate;
      an electrically conductive layer over the substrate;
      a movable element positioned over the substrate and movable between a first position spaced from the substrate by a first distance and a second position spaced from the substrate by a second distance, the first distance being greater than the second distance, and the movable element having a first surface facing away from the substrate and a second surface facing towards the substrate;
      at least one stationary member contacting the first surface of the movable element when the movable element is in the first position, wherein the at least one stationary member is configured to inhibit movement of at least a portion of the movable element when the movable element is in the first position, and further wherein the second surface of the movable element is substantially parallel to the substrate when the movable element is in the first position and the second position; and
      a mechanical layer coupled to the movable element, wherein the mechanical layer exerts a force on the movable element that facilitates contact between the at least one stationary member and the first surface of the movable element when the movable element is in the first position;
    a processor in electrical communication with the display, the processor being configured to process image data; and
    a memory device in electrical communication with the processor.

18. The device of claim 17, further comprising
    a first controller configured to send at least one signal to the display; and
    a second controller configured to send at least a portion of the image data to the first controller.

19. The device of claim 17, wherein the movable element comprises a reflecting element.

20. A method of modulating light, the method comprising:
    providing an electromechanical device, the device comprising:
      a substrate;
      an electrically conductive layer over the substrate;
      a movable element positioned over the substrate and movable between a first position spaced from the substrate by a first distance and a second position spaced from the substrate by a second distance, the first distance being greater than the second distance, and the movable element having a first surface facing away from the substrate and a second surface facing towards the substrate;

at least one stationary member contacting the first surface of the movable element when the movable element is in the first position, wherein the at least one stationary member is configured to inhibit movement of at least a portion of the movable element when the movable element is in the first position, and further wherein the second surface of the movable element is substantially parallel to the substrate when the movable element is in the first position and the second position; and a mechanical layer coupled to the movable element, wherein the mechanical layer exerts a force on the movable element that facilitates contact between the at least one stationary member and the first surface of the movable element when the movable element is in the first position; and moving the movable element between the first position and the second position.

21. The device of claim 20, wherein the movable element comprises a reflecting element.

22. A device comprising:

an array of at least two interferometric modulators, each interferometric modulator comprising:

a substrate;

an optical layer positioned over the substrate, the optical layer being at least partially transmissive to incident light;

a mirror mechanically coupled to and positioned over the substrate and movable between a first position spaced from the optical layer by a first distance and a second position spaced from the optical layer by a second distance, the first distance being greater than the second distance, and the mirror having a surface facing away from the substrate, wherein light reflected by the interferometric modulator is interferometrically modulated; and at least one stationary member contacting the surface of the mirror when the mirror is in the first position, wherein the at least one stationary member is configured to inhibit movement of at least a portion of the mirror when the mirror is in the first position;

wherein the stationary members of the at least two interferometric modulators contact the surface of each respective mirror at a different first distance from the optical layer when the mirrors are in the first position.

* * * * *